(12) United States Patent
Yoo et al.

(10) Patent No.: US 8,104,952 B2
(45) Date of Patent: Jan. 31, 2012

(54) MICRO HEAT FLUX SENSOR ARRAY

(75) Inventors: Jae-Wook Yoo, Suwon-si (KR);
Yun-Hyeok Im, Yongin-si (KR)

(73) Assignee: Samsung Electronics Co., Ltd.,
Gyeonggi-Do (KR)

( * ) Notice: Subject to any disclaimer, the term of this patent is extended or adjusted under 35 U.S.C. 154(b) by 141 days.

(21) Appl. No.: 12/659,212

(22) Filed: Mar. 1, 2010

(65) Prior Publication Data
US 2010/0158069 A1 Jun. 24, 2010

Related U.S. Application Data

(62) Division of application No. 11/700,905, filed on Feb. 1, 2007, now Pat. No. 7,699,520.

(30) Foreign Application Priority Data

Feb. 3, 2006 (KR) .......................... 10-2006-0010716

(51) Int. Cl.
*G01K 17/00* (2006.01)
(52) U.S. Cl. ................. 374/29; 374/30; 374/31; 374/43
(58) Field of Classification Search ................... 374/28, 374/30, 31, 43
See application file for complete search history.

(56) References Cited

U.S. PATENT DOCUMENTS

| | | | | |
|---|---|---|---|---|
| 3,680,374 A * | 8/1972 | Sumikama | | 374/30 |
| 4,197,738 A * | 4/1980 | Degenne | | 374/30 |
| 4,465,894 A * | 8/1984 | Reyes | | 136/225 |
| 4,717,786 A * | 1/1988 | Thery et al. | | 136/212 |
| 4,779,994 A * | 10/1988 | Diller et al. | | 374/29 |
| 4,850,713 A * | 7/1989 | Thery et al. | | 374/30 |
| 5,288,147 A * | 2/1994 | Schaefer et al. | | 374/10 |
| 6,278,051 B1 * | 8/2001 | Peabody | | 136/225 |
| 6,655,834 B1 * | 12/2003 | Frey et al. | | 374/179 |
| 2003/0173635 A1 * | 9/2003 | Akram et al. | | 257/467 |
| 2005/0105582 A1 * | 5/2005 | Thery et al. | | 374/29 |
| 2005/0169344 A1 * | 8/2005 | Hutter et al. | | 374/14 |

FOREIGN PATENT DOCUMENTS

| | | |
|---|---|---|
| JP | 03-191834 | 8/1991 |
| JP | 4-115581 | 4/1992 |
| JP | 2005-337750 | 12/2005 |
| KR | 10-2005-0060416 | 6/2005 |

OTHER PUBLICATIONS

Office Action dated Oct. 16, 2009 issued in a corresponding Chinese Application No. 2007100080025 w/English translation.

* cited by examiner

*Primary Examiner* — Lisa Caputo
*Assistant Examiner* — Mirellys Jagan
(74) *Attorney, Agent, or Firm* — Harness, Dickey & Pierce, P.L.C.

(57) ABSTRACT

Provided is a micro heat flux sensor array having reduced heat resistance. A micro heat flux sensor array may include a substrate, a plurality of first sensors formed on a first side of the substrate, and a plurality of second sensors formed on a second side of the substrate. Each of the plurality of first and second sensors may include a first wiring pattern layer of a first conductive material, a second wiring pattern layer of a second conductive material contacting the first wiring pattern layer, and an insulating layer in contact with the first and second wiring patterns.

8 Claims, 7 Drawing Sheets

MICRO HEAT FLUX SENSOR ARRAY

PRIORITY CLAIM

This application is a Divisional of U.S. application Ser. No. 11/700,905 filed Feb. 1, 2007 now U.S. Pat. No. 7,699,520, which claims the benefit of the Korean Patent Application No. 10-2006-0010716 filed on Feb. 3, 2006, both of which are incorporated by reference in their entirety.

BACKGROUND

1. Field of the Example Embodiments

Example embodiments may relate to a micro heat flux sensor array. More particularly, example embodiments may relate to a micro heat flux sensor array capable of measuring heat flux in all directions.

2. Description of the Related Art

Due to the ever increasing performance level of semiconductor chips, the operating power of semiconductor chips continues to increase. In the case of microprocessors, memories, and micro-electro-devices (semiconductor chips), heat generated during operation of a semiconductor chip must be effectively radiated to reduce/prevent the deterioration of the semiconductor chip. In order to effectively radiate heat from a semiconductor package containing a semiconductor chip, temperatures of each component of the semiconductor chip should be measured.

Thus, due to an increasing need to accurately measure physical quantities that indicate heat transfer in the semiconductor chip, various heat flux sensors are being developed.

However, conventional heat flux sensors on the surface of a semiconductor chip may act as heat resistances; therefore, it may be difficult to accurately measure the heat flux. Also, it may be difficult to accurately determine the heat transfer route, because conventional heat flux sensors may measure the heat flux after the heat transfer route has been altered by the heat flux sensor.

SUMMARY

Example embodiments may provide a micro heat flux sensor array having a reduced heat resistance.

In an example embodiment, a micro heat flux sensor array may include a substrate, a plurality of first sensors formed on a first side of the substrate, and a plurality of second sensors formed on a second side of the substrate. The plurality of first and second sensors each may include a first wiring pattern layer of a first conductive material, a second wiring pattern layer of a second conductive material contacting the first wiring pattern layer, and an insulating layer, interposed between the first and second wiring pattern layers, having via holes therein through which the first and second wiring pattern layers make contact, respectively.

In another example embodiment, a micro heat flux sensor array may include a substrate, a plurality of first sensors formed on a first side of the substrate, and a plurality of second sensors formed on a second side of the substrate. Each of the plurality of first and second sensors may include a first wiring pattern layer of a first conductive material, a second wiring pattern layer of a second conductive material contacting the first wiring pattern layer, an insulating layer, interposed between the first and second wiring pattern layers, having via holes therein through which the first and second wire pattern layers make contact, respectively, and a plurality of grooves formed at desired intervals on the insulating layer.

In another example embodiment, a micro heat flux sensor array may include a substrate, a plurality of first sensors formed on a first side of the substrate, and a plurality of second sensors formed on a second side of the substrate. Each of the plurality of first and second sensors may include a first wiring pattern layer of a first conductive material, a second wiring pattern layer of a second conductive material contacting the first wiring pattern layer, an embossed insulating layer having a plurality of protrusions at desired intervals and in contact with the first and second wiring patterns, and a plurality of grooves formed between adjacent protrusions on the insulating layer.

DESCRIPTION OF EXAMPLE EMBODIMENTS

Figure 1:
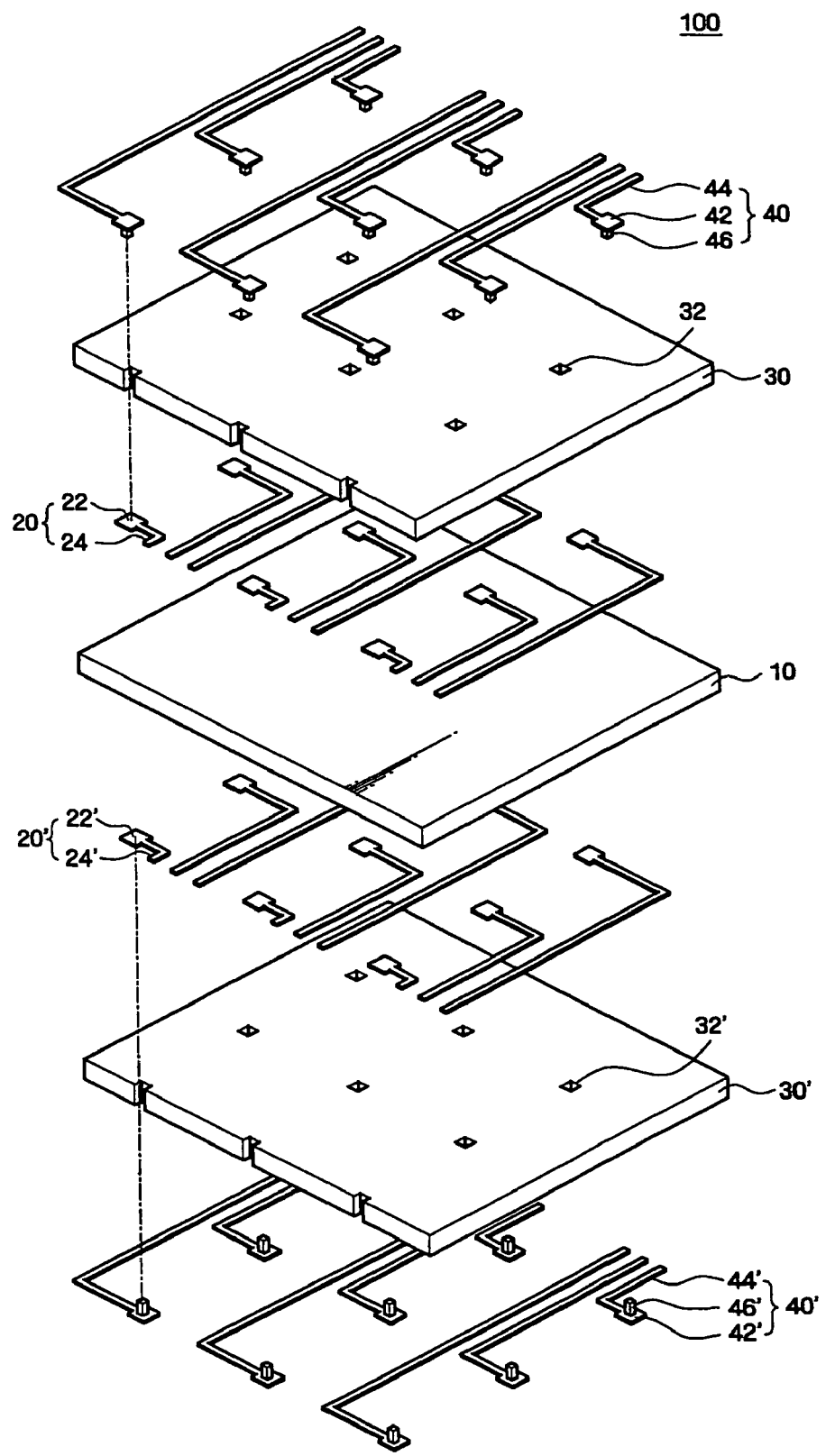
FIG. 1 is a disassembled perspective view illustrating a micro heat flux sensor array according to an example embodiment.

Features of example embodiments may be understood more readily by reference to the following detailed description thereof and the accompanying drawings. Example embodiments may, however, be embodied in many different forms and should not be construed as being limited to the description set forth herein. Rather, example embodiments may be provided so that this disclosure will be thorough and will convey the concept of the example embodiments to those skilled in the art. Like reference numerals refer to like elements throughout the specification.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an example embodiment will be described with reference to FIGS. 1 through 4E.

Figure 2:
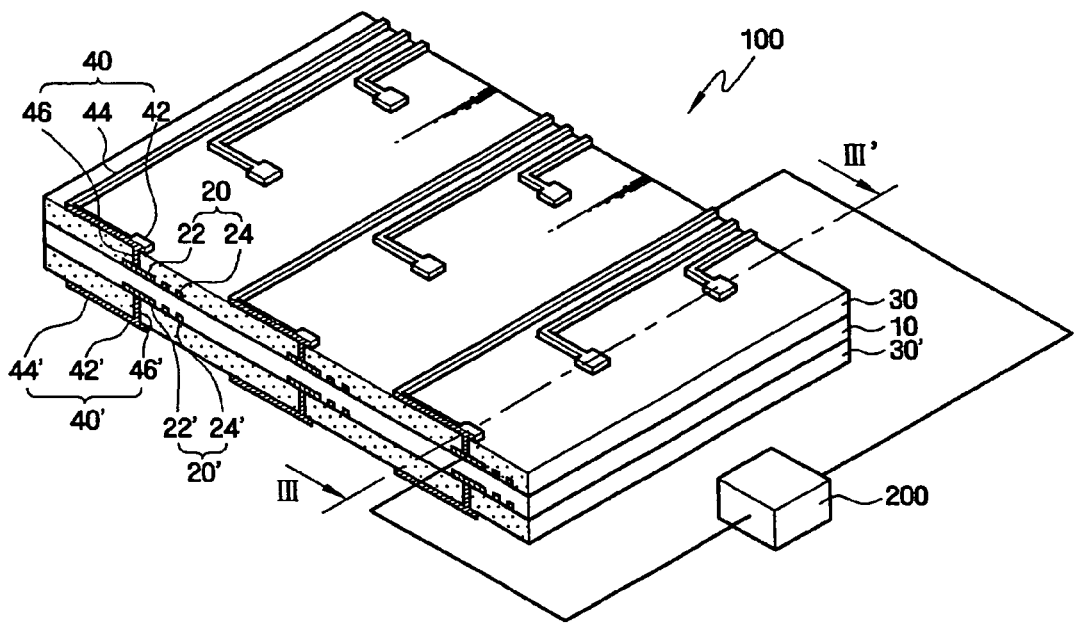
FIG. 2 is an assembled perspective view illustrating the micro heat flux sensor array of FIG. 1.

First, a micro heat flux sensor array according to an example embodiment will be described with reference to FIGS. 1 through 3. FIG. 1 is a disassembled perspective view illustrating a micro heat flux sensor array according to an example embodiment; FIG. 2 is an assembled perspective view illustrating the micro heat flux sensor array of FIG. 1; and FIG. 3 is a sectional view taken along a line III-III' of FIG. 3.

Figure 3:
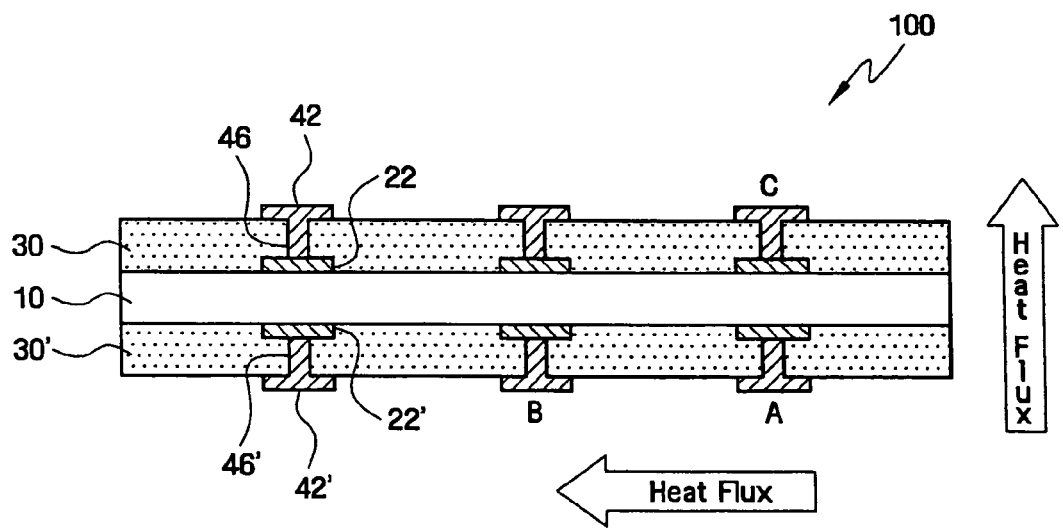
FIG. 3 is a sectional view taken along a line III-III' of FIG. 2.

Referring to FIGS. 1 through 3, a micro heat flux sensor array 100 may include a substrate 10, an upper sensor having a first wiring pattern layer 20, an insulating layer 30, and a second wiring pattern layer 40, which may be sequentially stacked on a first side of the substrate 10, and a lower sensor having a first wiring pattern layer 20', an insulating layer 30', and a second wiring pattern layer 40', which may be symmetrical to the upper sensor and sequentially stacked on a second side of the substrate 10.

In order to apply the micro heat flux sensor array 100 to any area/device to be measured, a flexible film may be used as the substrate 10. For example, polyimide (PI) may be used as the substrate 10. Also, in order to reduce the heat resistance of the micro heat flux sensor array 100, the heat conductivity of the micro heat flux sensor array 100 may be increased by further providing conductive metal balls (not shown) on the substrate 10.

The first wiring pattern layer 20 of a first conductive material may be formed on the first side of the substrate 10. The first wiring pattern layer 20 may include a first measuring pattern 22, which may be provided at each temperature measurement site, and a first routing wire 24 connecting the respective first measuring pattern 22 to an external heat flux measuring apparatus 200. The surface of the first wiring pattern layer 20 may be plated with a plating layer in order to prevent/reduce corrosion and to increase strength. For example, tin (Sn) may be used as the plating layer.

The first wiring pattern layer 20 and the first measuring pattern 22 may be formed on the insulating layer 30. Solder-resist (SR) may be used as the insulating layer 30.

The second wiring pattern layer 40 of a second conductive material may be disposed on the insulating layer 30. The second wiring pattern layer 40 may include a second measuring pattern 42, which may provided at locations corresponding to the first measuring pattern 22, a second routing wire 44 connecting the respective second measuring pattern 42 to the external heat flux measuring apparatus 200, and a connection pattern 46 which may protrude from the respective second measuring pattern 42 through via holes 32 to contact the first measuring pattern 22. The surface of the second wiring pattern layer 40 may be plated with a plating layer in order to prevent/reduce corrosion and to increase strength. For example, tin (Sn) may be used as the plating layer.

The first conductive material of the first wiring pattern layer 20 and the second conductive material of the second wiring pattern layer 40 may be of different materials with respect to each other, or may be of the same material. If the first metal pattern layer 20 and the second metal pattern layer 40 are of different materials, the first metal pattern layer 20 and the second metal pattern layer 40 may form a thermocouple, and a potential difference between the first wiring pattern layer 20 and the second wiring pattern layer 40 may be measured by the heat flux measuring apparatus 200 to calculate heat flux. The heat flux calculating method will be explained in detail later.

To facilitate the connection of the first routing wire 24 and the second routing wire 44 to the heat flux measuring apparatus 200, the first routing wire 24 and the second routing wire 44 may be routed in various directions.

As described above, because the lower sensor may include the first wiring pattern layer 20', the insulating layer 30', and the second wiring pattern layer 40' sequentially stacked on the substrate 10, which may be similarly configured as the upper sensor, an explanation thereof will be omitted. In order to efficiently measure the heat flux in a vertical direction, bond portions of the first wiring pattern layers 20, 20' and the second wiring pattern layers 40, 40', which are respectively disposed on both sides of the substrate 10, may be located along the same perpendicular line. In other words, the first measuring patterns 22, 22' and the second measuring patterns 42, 42' may be preferably positioned along the same perpendicular line.

Hereinafter, operation of the micro heat flux sensor array according to an example embodiment will be described with reference to FIGS. 2 and 3.

In the example embodiment, the first wiring pattern layers 20, 20' and the second wiring pattern layers 40, 40' may be of different materials.

In general, in a closed circuit having two regions on either side of a bond portion with two kinds of electrically conductive materials, a potential difference between the two regions may be created by maintaining the two regions at different temperatures. The correlation between temperature and electromotive force varies according to the kind of conductive material, and the correlation due to the Seebeck effect between temperature and electromotive force is known. Therefore, the temperature may be calculated by measuring the potential difference. A sensor which measures temperature using two kinds of conductive materials that are in contact with each other is called a thermocouple sensor.

As illustrated in FIGS. 2 and 3, the micro heat flux sensor array 100 may include an upper thermocouple sensor having the first wiring pattern layer 20 and the second wiring pattern layer 40 on the substrate 10, and a lower thermocouple sensor having the first wiring pattern layer 20' and the second wiring pattern layer 40' below the substrate 10.

Each of the upper and the lower thermocouple sensors may be constructed such that the first measuring patterns 22, 22' of the first wiring pattern layer 20, 20' are connected to the second measuring pattern 42, 42' of the second measuring pattern layer 40, 40' by the connection patterns 46, 46'.

Hereinafter, a method of measuring the heat flux of an area/device whose heat flux is to be measured in a state in which the second wiring pattern layer 40' of the lower thermocouple sensor is connected to the area/device will be described. Referring to FIG. 3, heat generated by the area/device may migrate in both horizontal and vertical directions through the micro heat flux sensor array 100. For example, if the temperature of thermocouple sensor A and the temperature of thermocouple sensor B are measured, the heat flux which may be generated by the area/device and migrates in the horizontal direction may be inferred. Also, if the temperature of thermocouple sensor A and thermocouple sensor C are measured, the heat flux which may be generated by the area/device and migrates in the vertical direction may also be inferred.

As described above, according to the micro heat flux sensor array 100 of the example embodiment, a plurality of heat flux thermocouple sensors may be formed on the upper side and the lower side of the substrate 10 to measure both the horizontal and vertical heat flux. Also, conductive metal balls may be disposed on the substrate 10 in order to increase the heat conductivity of the micro heat flux sensor array 100 to lower the heat resistance of the micro heat flux sensor array 100.

In another example, the first wiring pattern layer 20, 20' and the second wiring pattern layer 40, 40' may be of the same material.

In general, the resistance of a conductive material may be proportional to the temperature of the conductive material. The correlation between temperature and resistance varies according to the type of the conductive material, wherein the temperature may be calculated by measuring the resistance. A sensor which measures temperature based on the resistance of the conductive materials is called a Resistance Temperature Detector (RTD).

As shown in FIGS. 2 and 3, the micro heat flux sensor array 100 may include an upper RTD having the first wiring pattern layer 20 and the second wiring pattern layer 40 on the substrate 10, and a lower RTD having the first wiring pattern layer 20' and the second wiring pattern layer 40' below the substrate 10.

Components of each of the upper and the lower RTD may be connected by the connection patterns 46, 46', which may connect the first measuring patterns 22, 22' to the second measuring patterns 42, 42', respectively.

A method of measuring the heat flux of an area/device whose heat flux is to be measured in a state in which the second wiring pattern layer 40' of the lower RTD is connected to the area/device will be described. Referring to FIG. 3, heat which may be generated by the area/device may migrate in both horizontal and vertical directions through the micro heat flux sensor array 100. For example, if the temperature of RTD A and the temperature of RTD B are measured, the heat flux which may be generated by the area/device and migrates in the horizontal direction may be inferred. Also, if the temperature of RTD A and the temperature of RTD C are measured, the heat flux which may be generated by the area/device and migrates in the vertical direction may also be inferred.

As described above, according to the micro heat flux sensor array 100 of the example embodiment, a plurality of RTDs may be disposed on the upper side and the lower side of the substrate 10 to measure both the horizontal and vertical heat flux. Also, conductive metal balls may be disposed on the substrate 10 in order to increase the heat conductivity of the micro heat flux sensor array 100 to lower the heat resistance of the micro heat flux sensor array 100.

Hereinafter, a method of fabricating a micro heat flux sensor array according to an example embodiment will be described with reference to FIG. 3 and FIGS. 4A through 4E. FIGS. 4A through 4E are sectional views sequentially illustrating a method of fabricating a micro heat flux sensor array according to an example embodiment.

Figure 4A:
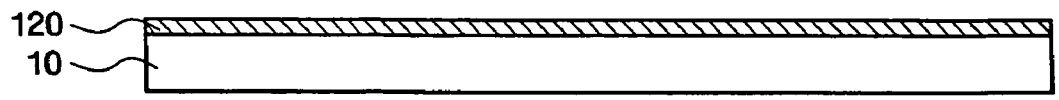
FIGS. 4A through 4E are sectional view sequentially illustrating a method of fabricating a micro heat flux sensor array according to an example embodiment.

As shown in FIG. 4A, a first conductive layer 120 may be formed on a polyimide substrate 10. The first conductive layer 120 may be formed on the substrate 10 by an electroplating method after forming a seed layer by a sputtering method.

To control the thickness of the first conductive layer 120 or remove an oxidation layer on the first conductive layer 120, a soft etching process may be performed.

Figure 4B:
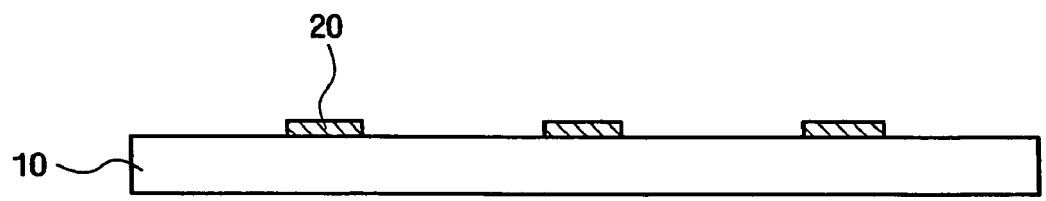

The first conductive layer 120 may be patterned to form a first wiring pattern layer 20 as illustrated in FIG. 4B. In addition, an electroplating process to electroplate the surface of the first wiring pattern layer 20 with tin (Sn) or another metal may be performed (not shown).

Figure 4C:
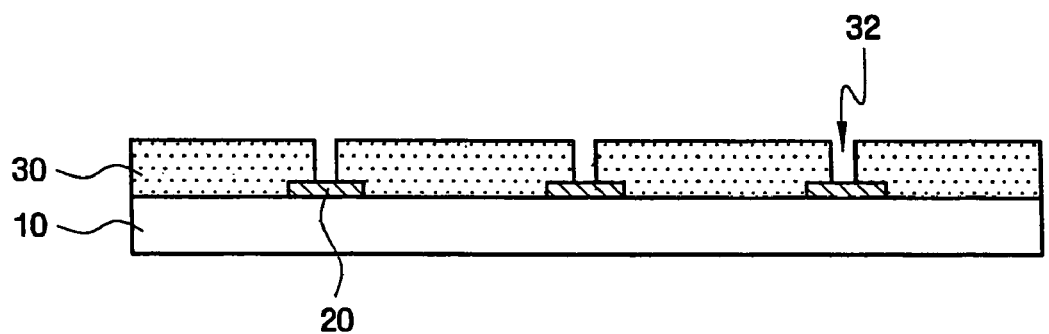

Referring to FIG. 4C, an insulating layer 30 including a via hole 32 may be formed on the first wiring pattern layer 20. The insulating layer 30 may be formed by a screen printing method.

Figure 4D:
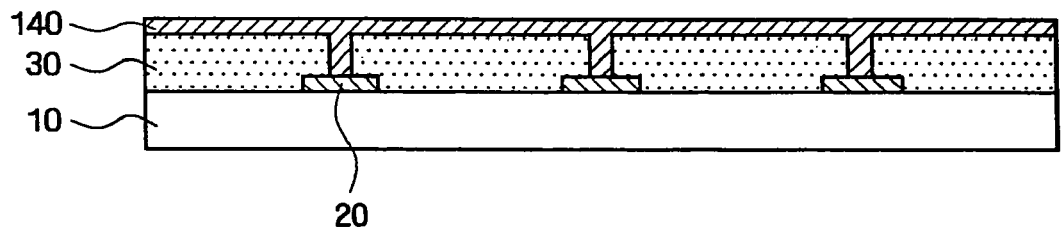

As illustrated in FIG. 4D, a second conductive layer 140 may be formed on the insulating layer 30. The second conductive layer 140 may be formed on the substrate 10 by an electroplating method after forming a seed layer by a sputtering method.

Figure 4E:
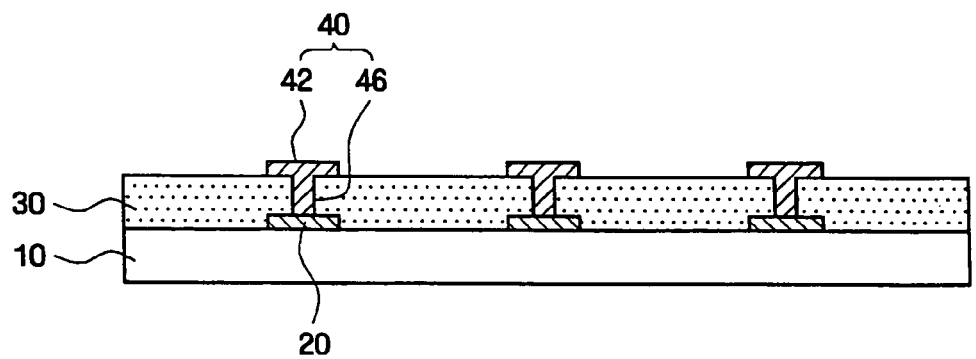

The second conductive layer 140 may be patterned to form a second wiring pattern layer 40 as illustrated in FIG. 4E. In addition, an electroplating process to electroplate the surface of the second wiring pattern layer 40 with tin (Sn) or another metal may be performed (not shown).

As described above, after the upper sensor is formed a first side of the substrate 10, the same process may be performed on a second side of the substrate 10. For example, as illustrated in FIG. 3, a first wiring pattern layer 20', an insulating layer 30', and a second wiring pattern layer 40' may be formed on the second side of the substrate 10 to complete the manufacturing of the lower sensor.

Figure 5:
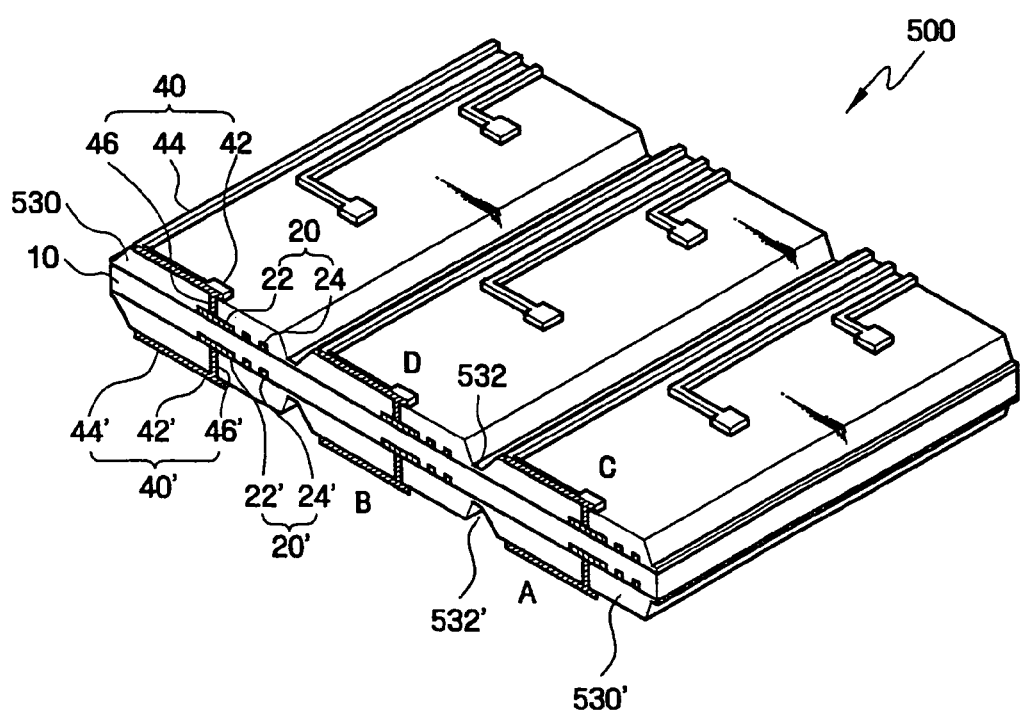
FIG. 5 is a perspective view illustrating a micro heat flux sensor array according to another example embodiment.

Hereinafter, another example embodiment will be described with reference to FIG. 5. FIG. 5 is a perspective view illustrating a micro heat flux sensor array according to another example embodiment. The description of elements having the same function as elements in the drawings of the first example embodiment (FIGS. 4A-4E) are represented with the same reference numerals, and therefore, explanations thereof will be omitted. As illustrated in FIG. 5, a micro heat flux sensor array 500 according to the example embodiment may have the same structure as the micro heat flux sensor array 100 of the first example embodiment. However, a plurality of grooves 532, 532' may be formed on insulating layers 530, 530' at desired intervals, as illustrated in FIG. 5. The grooves 532, 532', for example, may be formed at bond portions between the adjacent first wiring pattern layer 20, 20'.

An accurate measurement may be performed by forming the groove 532, 532' on the insulating layer 530, 530'. A case in which the second wiring pattern layer 40' located under the substrate 10 contacts an area/device whose heat flux is to be measured will be described. As illustrated in FIG. 5, temperature of region A and temperature of region B may be measured to ascertain the heat flux which may be generated by the area/device and migrates in a horizontal direction. Also, the temperature of region A and temperature of region C may be measured to ascertain the heat flux which may be generated by the area/device and migratesin a vertical direction.

Inconsistent and inaccurate measurements of the horizontal heat flux between region A and region B may be reduced and/or avoided with example embodiments, because the area/device directly contacts the second wiring pattern layer 40' at region A and region B. However, in the case of the vertical heat flux, the heat released from region A may not migrate vertically, but radiate like spokes on a wheel, so a vertical heat flux difference may occur. In other words, the migrating heat from region A not only reaches region C but may also reach region D. Therefore, the measured temperature of region C may be lowered than the true temperature.

As described above, the grooves 532, 532' may be formed on the insulating layers 530, 530' in order to reduce measurement error of the horizontal heat flux. Because the grooves 532, 532' reduce and/or prevent heat from migrating in a horizontal direction, the heat flux in the vertical direction may be accurately measured.

Hereinafter, another example embodiment will be described with reference to FIGS. 6 through 9C.

Figure 6:
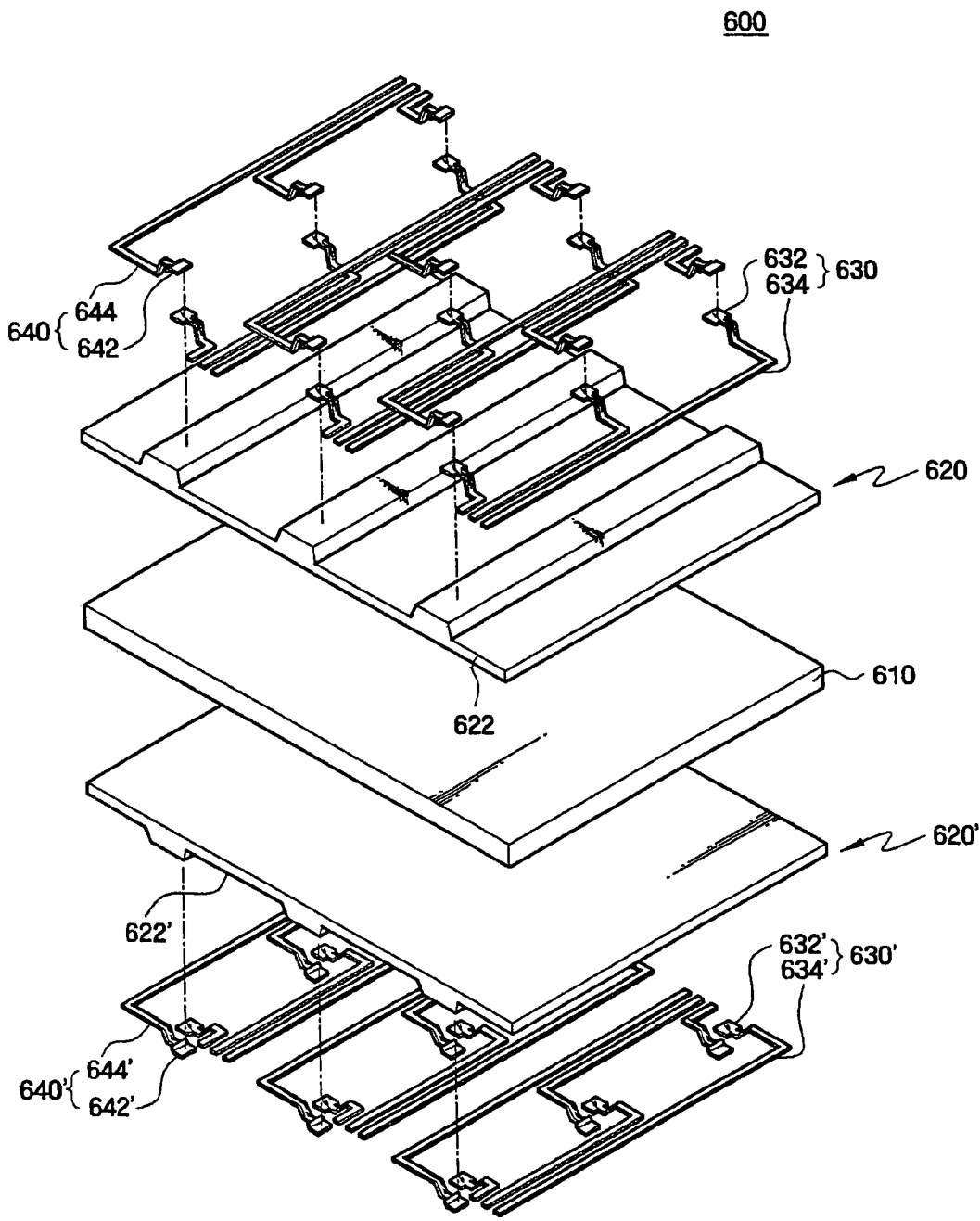
FIG. 6 is a disassembled perspective view illustrating a micro heat flux sensor array according to another example embodiment.
Figure 7:
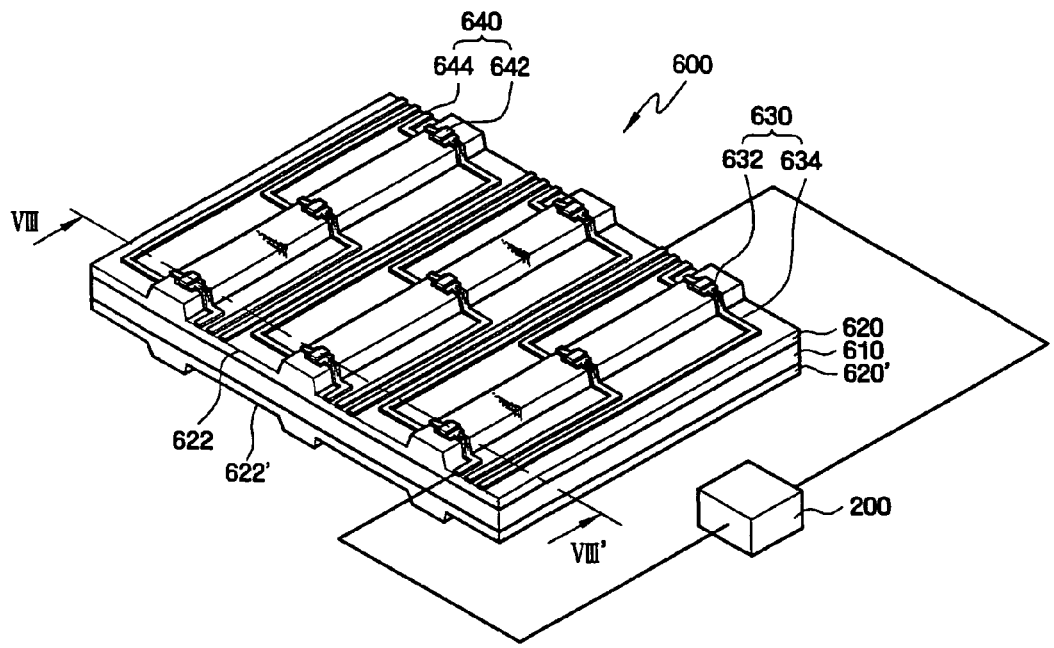
FIG. 7 is an assembled perspective view illustrating the micro heat flux sensor array of FIG. 6.

First, a micro heat flux sensor array according to the example embodiment will be described with reference to FIGS. 6 through 8. FIG. 6 is a disassembled perspective view illustrating a micro heat flux sensor. FIG. 7 is an assembled perspective view illustrating the micro heat flux sensor array of FIG. 6, and FIG. 8 is a sectional view taken along a line VIII-VIII' of the micro heat flux sensor array of FIG. 7.

Figure 8:
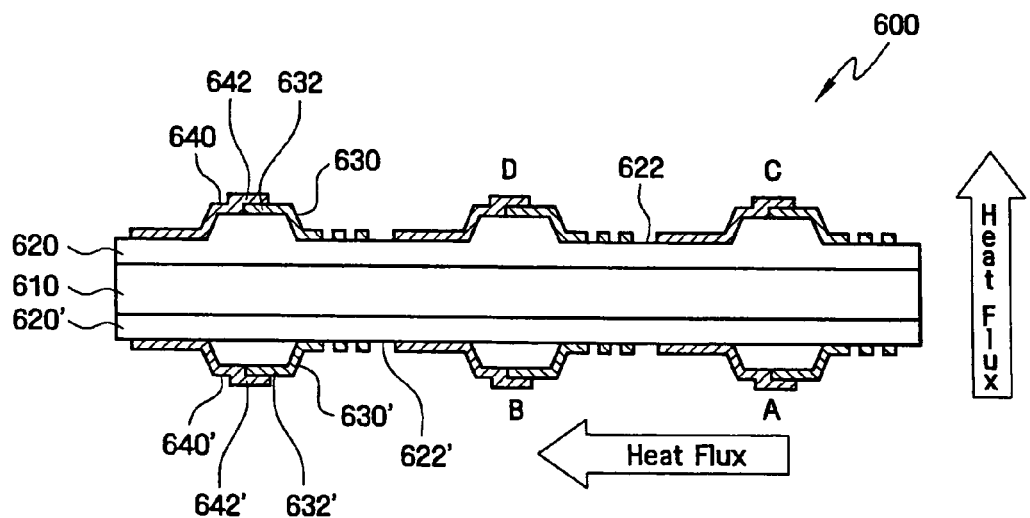
FIG. 8 is a sectional view taken along a line VIII-VIII' of FIG. 7.

Referring to FIGS. 6 through 8, a micro heat flux sensor array 600 may include a substrate 610, an upper sensor having an insulating layer 620, a first wiring pattern layer 630, and a second wiring pattern layer 640, which may be sequentially stacked a first side of the substrate 610, and a lower sensor having an insulating layer 620', a first wiring pattern layer 630', and a second wiring pattern layer 640', which may be symmetrical to the upper sensor, and sequentially stacked on a second side of the substrate 610.

In order to arrange the micro heat flux sensor array 600 to the shape of any area/device to be measured, a flexible film may be used as the substrate 610. For example, polyimide (PI) may be used as the substrate 610. In order to reduce the heat resistance of the micro heat flux sensor array 600, the heat conductivity of the micro heat flux sensor array 600 may be raised by adding conductive metal balls (not shown) to the substrate 610.

The insulating layer 620 formed on one side of the substrate 610 may be embossed. In other words, the insulating layer 620 may include grooves 622 at desired intervals. The insulating layer 620 may be formed of solder resist (SR).

The first wiring pattern layer 630 of a first conductive material may be formed on the insulating layer 620. The first wiring pattern layer 630 may include a first measuring pattern 632, which may be formed at each temperature measurement site, and first routing wires 634 connecting the first measuring pattern 632 to an external heat flux measuring apparatus 200. The surface of the first wiring pattern layer 630 may be plated with a plating layer in order to prevent/reduce corrosion and increase strength. For example, tin (Sn) may be used as the plating layer.

The second wiring pattern layer 640, which may include a second conductive material, may partially overlap the first wiring pattern layer 630, and may be formed on the insulating layer 620. The second wiring pattern layer 640 may include a second measuring pattern 642 which overlap and contact the first measuring patterns 632, and a second routing wire 644 connecting the second measuring pattern 642 to an external heat flux measuring apparatus 200. The surface of the second wiring pattern layer 640 may be plated with a plating layer in order to prevent/reduce corrosion and to increase strength. For example, tin (Sn) may be used as the plating layer.

The first measuring pattern 632 and the second measuring pattern 642, which contact an area/device where heat flux may be measured; may be formed on a protrusion of the insulating layer 620. In other words, the insulating later 620 may include step areas (embossed) where the first measuring pattern 632 and the second measuring pattern 642 may be provided. Also, the first routing wire 634, which may be connected with the first measuring pattern 632, and the second routing wire 644, which may be connected with the second measuring pattern 642, may be formed on the groove 622 in order to prevent/reduce disconnection caused by contact with the area/device to be measured.

The first conductive material of the first wiring pattern layer 630 and the second conductive material of the second wiring pattern layer 640 may be of different materials or may be the same material. As described in the first example embodiment, when the first wiring pattern layer 630 and the second wiring pattern layer 640 may be of different materials, the first wiring pattern layer 630 and the second wiring pattern layer 640 may form a thermocouple, and a potential difference between the first wiring pattern layer 630 and the second wiring pattern layer 640 may be measured by the heat flux measuring apparatus 200 to calculate heat flux. Also, when the first wiring pattern layer 630 and the second wiring pattern layer 640 are of the same material, a resistance between the first wiring pattern layer 630 and the second wiring pattern layer 640 may be measured by the heat flux measuring apparatus 200, and the measured resistance may be used to calculate the heat flux.

In order to facilitate connection of the first routing wire 634 and the second routing wire 644 to the heat flux measuring apparatus 200, the first routing wire 634 and the second routing wire 644 may be routed in various directions.

As described above, the lower sensor may include the insulating layer 620', the first wiring pattern layer 630', and the second wiring pattern layer 640' sequentially stacked on a second side of the substrate 610, including grooves 622', substantially in the same manner as the upper sensor, accordingly an explanation thereof will not be provided. In order to efficiently measure the heat flux in a vertical direction, bond portions of the first wiring pattern layer 630, 630' and the second wiring pattern layer 640, 640' arranged on each side of the substrate 610 may be located along the same perpendicular line.

Operation of the micro heat flux sensor array according to the example embodiment is similar to the second example embodiment. In other words, the example embodiment not only accurately measures the horizontal heat flux, but may also reduce the vertical heat flux error by the grooves 622, 622' formed on the insulating layer 620, 620'.

Figure 9A:
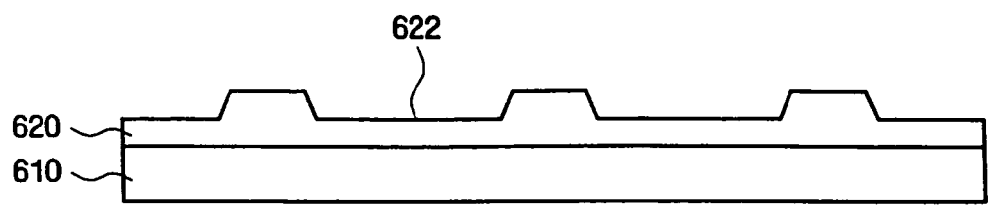
FIGS. 9A through 9C are sectional view sequentially illustrating a method of fabricating a micro heat flux sensor array according to another example embodiment.
Figure 9B:
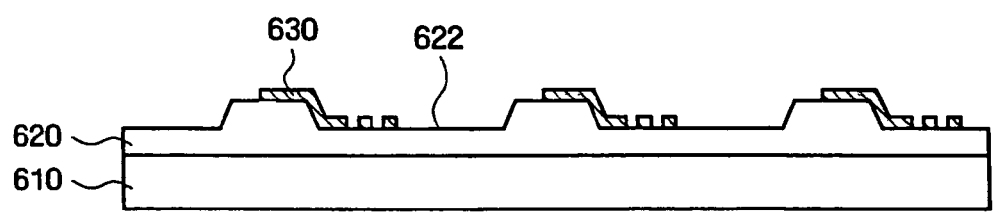
Figure 9C:
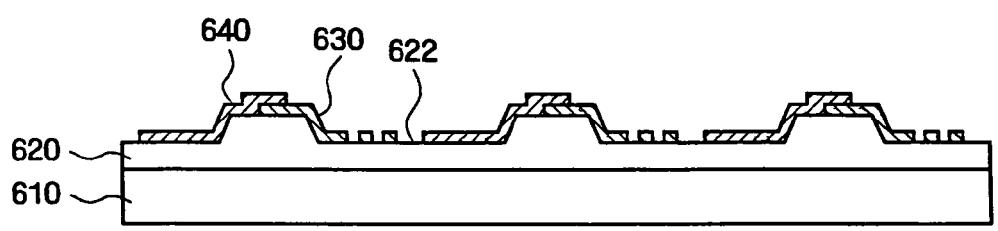

Hereinafter, a method of fabricating a micro heat flux sensor array according to the example embodiment will be described with reference to FIG. 8, and FIGS. 9A-9C. FIGS. 9A through 9C are sectional views sequentially illustrating a method of fabricating a micro heat flux sensor array.

As shown in FIG. 9A, an insulating layer 620 may be formed on a polyimide substrate 610. The insulating layer 620 may include a plurality of grooves 622 spaced apart from one another at desired intervals. The insulating layer 620 may be formed by a screen printing method.

Next, referring to FIG. 9B, a first conductive layer (not shown) may be formed on the insulating layer 620, and the first conductive layer may be patterned to form a first wiring pattern layer 630. The first conductive layer may be formed by an electroplating method after a seed layer is formed on the insulating layer 620 by a sputtering method. In addition, an electroplating process to electroplate a surface of the first wiring pattern layer 640 with tin (Sn) may be performed (not shown).

Referring to FIG. 9C, a second conductive material layer (not shown) may be formed on the first wiring pattern layer 630, and the second conductive material layer may be patterned to form the second wiring pattern layer 640, which may overlap a desired portion of the first wiring pattern layer 630. The second conductive layer may be formed by an electroplating method after a seed layer is formed on the substrate 610 by the sputtering method. In addition, an electroplating process to electroplate a surface of the first wiring pattern layer 640 with tin (Sn) may be performed.

As described above, after the upper sensor is formed a first side of the substrate 610, the same process may be performed again a second side of the substrate 610. Therefore, as illustrated in FIG. 8, an insulating layer 620', a first wiring pattern layer 630', and a second wiring pattern layer 640' may be formed on the second side of the substrate 610 to complete the lower sensor.

While example embodiments have been illustrated and described, it will be apparent to those skilled in the art that all variations and equivalents which fall within the range of the claims attached thereto are intended to be embraced therein. Therefore, it should be understood that the above example embodiments are not limitative, but illustrative in all aspects.

As described above, in the structures and methods of fabricating micro heat flux sensor array according to example embodiments may reduce heat resistance of the micro heat flux sensor and accurately measure horizontal heat flux as well as vertical heat flux.

The invention claimed is:

1. A micro heat flux sensor array, comprising:
   a substrate;
   a plurality of first sensors formed on a first side of the substrate; and
   a plurality of second sensors formed on a second side of the substrate,
   wherein each of the plurality of first and second sensors include,
      a first wiring pattern layer of a first conductive material,
      a second wiring pattern layer of a second conductive material contacting the first wiring pattern layer,
      an embossed insulating layer having a plurality of protrusions at desired intervals and in contact with the first and second wiring pattern layers, and
      a plurality of grooves formed between adjacent protrusions on the insulating layer.

2. The micro heat flux sensor array of claim 1, wherein the first wiring pattern layer and the second wiring pattern layer contact each other on the respective plurality of protrusion.

3. The micro heat flux sensor array of claim 1, wherein the first wiring pattern layer and the second wiring pattern layer are of different materials.

4. The micro heat flux sensor array of claim 1, wherein the first wiring pattern layer and the second wiring pattern layer are of the same material.

5. The micro heat flux sensor array of claim 1, wherein the substrate includes a flexible film.

6. The micro heat flux sensor array of claim 1, wherein the substrate includes conductive metal balls.

7. The micro heat flux sensor array of claim 1, wherein the first wiring pattern layer includes a plurality of first measuring patterns disposed on respective temperature measuring regions, and a plurality of first routing wires configured to connect the plurality of first measuring pattern to an external heat flux measuring apparatus.

8. The micro heat flux sensor array of claim 7, wherein the second wiring pattern layer includes a plurality of second measuring patterns disposed on locations corresponding to the plurality of first measuring pattern, and a plurality of second routing wires configured to connect the respective plurality of second measuring patterns to the external heat flux measuring apparatus.

* * * * *